United States Patent
Maeda et al.

(10) Patent No.: US 7,855,447 B2
(45) Date of Patent: Dec. 21, 2010

(54) SEMICONDUCTOR INTEGRATED CIRCUIT DEVICE, PDP DRIVER, AND PLASMA DISPLAY PANEL

(75) Inventors: Eisaku Maeda, Osaka (JP); Hiroshi Ando, Osaka (JP); Jinsaku Kaneda, Osaka (JP); Akihiro Maejima, Osaka (JP); Hiroki Matsunaga, Osaka (JP)

(73) Assignee: Panasonic Corporation, Osaka (JP)

( * ) Notice: Subject to any disclaimer, the term of this patent is extended or adjusted under 35 U.S.C. 154(b) by 379 days.

(21) Appl. No.: 12/067,953

(22) PCT Filed: Mar. 22, 2007

(86) PCT No.: PCT/JP2007/055819
§ 371 (c)(1),
(2), (4) Date: Mar. 25, 2008

(87) PCT Pub. No.: WO2007/114057
PCT Pub. Date: Oct. 11, 2007

(65) Prior Publication Data
US 2009/0108434 A1   Apr. 30, 2009

(30) Foreign Application Priority Data
Apr. 4, 2006   (JP) .............................. 2006-103040

(51) Int. Cl.
*H01L 23/52* (2006.01)

(52) U.S. Cl. ........................................ 257/691; 257/784

(58) Field of Classification Search .................. 257/691, 257/666, 784, 786
See application file for complete search history.

(56) References Cited

U.S. PATENT DOCUMENTS

| 5,900,643 A * | 5/1999 | Preslar et al. .................. 257/48 |
| 6,903,448 B1 * | 6/2005 | Sutardja et al. ............. 257/666 |
| 6,921,979 B2 * | 7/2005 | Downey et al. ............. 257/773 |

FOREIGN PATENT DOCUMENTS

| JP | 61-216343 | 9/1986 |
| JP | 63-62336 | 3/1988 |
| JP | 6-80671 | 10/1994 |
| JP | 2004-22777 | 1/2004 |
| JP | 2005-55394 | 3/2005 |

\* cited by examiner

*Primary Examiner*—S. V Clark
(74) *Attorney, Agent, or Firm*—Steptoe & Johnson LLP

(57) ABSTRACT

In a semiconductor integrated circuit device of the present invention, temperature increase of a bonding wire can be suppressed even when conductive leads are short-circuited with each other, and reliability of the semiconductor integrated circuit device is improved. The conductive leads of a resin package for supplying a power supply section of a semiconductor integrated circuit chip with power from an external power supply are connected with bonding pads of the semiconductor integrated circuit chip by a plurality of bonding wires. Furthermore, the conductive leads connected to a GND for supplying the power supply section of the semiconductor integrated circuit chip with a grounding potential are connected with the bonding pads of the semiconductor integrated circuit chip by a plurality of bonding wires.

15 Claims, 3 Drawing Sheets

SEMICONDUCTOR INTEGRATED CIRCUIT DEVICE, PDP DRIVER, AND PLASMA DISPLAY PANEL

TECHNICAL FIELD

The present invention relates to a semiconductor integrated circuit device formed of a resin package on which a semiconductor integrated circuit chip having a high breakdown voltage output circuit is mounted, a PDP driver (a Plasma Display Panel Driver) on which the semiconductor integrated circuit device is mounted, and a plasma display panel on which the PDP driver is mounted.

BACKGROUND ART

A configuration shown in FIG. 3 has been known as a conventional PDP driver and a conventional semiconductor integrated circuit device. In FIG. 3, reference numeral 1 represents a high side transistor, reference numeral 2 represents a low side transistor, reference numeral 3 represents a level shift circuit, reference numeral 4 represents a pre-driver, reference numerals 5a, 5b, 5c, and 5d represent bonding pads, reference numerals 6a, 6b, 6c, and 6d represent bonding wires, reference numerals 7a, 7b, 7c, and 7d represent conductive leads, reference numeral 8 represents a semiconductor integrated circuit chip, reference numeral 9 represents a resin package, reference numeral 10 represents an external output load, reference numeral 12 represents an external power supply, and reference numeral 13 represents a DC/DC converter.

The semiconductor integrated circuit device includes the semiconductor integrated circuit chip 8 and the resin package 9. The semiconductor integrated circuit chip 8 is molded with epoxy resin and the like.

In the semiconductor integrated circuit chip 8, a high breakdown voltage output circuit is provided. In the high breakdown voltage output circuit, the high side transistor 1 and the low side transistor 2 are disposed in series, the level shift circuit 3 and the pre-driver 4 are provided to be arranged with these transistors 1 and 2, and the plurality of bonding pads 5a, 5b, 5c, and 5d are disposed on a peripheral portion thereof. The high breakdown voltage output circuit switches the high side transistor 1 and the low side transistor 2 in accordance with a signal inputted to the pre-driver 4, and thus gives a high voltage electric potential or a grounding potential to the external output load 10.

In an outer peripheral portion of the resin package 9, the conductive leads 7a, 7b, 7c, and 7d are disposed in order to give a high voltage electric potential, a grounding potential, and an input signal to the semiconductor integrated circuit chip 8 and to give an output potential from the semiconductor integrated circuit chip 8 to the external output load 10. The conductive leads 7a, 7b, 7c, and 7d are connected with the corresponding bonding pads 5a, 5b, 5c, and 5d by the bonding wires 6a, 6b, 6c, and 6d.

In addition, the PDP driver includes the semiconductor integrated circuit chip 8, the resin package 9, the external output load 10, the DC/DC converter 13, and the external power supply 12. The DC/DC converter 13 is used to boost the electric potential of the external power supply 12 to a high voltage, and is connected to the conductive lead 7a of a high voltage power supply of the resin package 9.

In the case of the configurations of such general PDP driver and semiconductor integrated circuit device, the conductive leads 7a, 7b, 7c, and 7d and the bonding pads 5a, 5b, 5c, and 5d of the semiconductor integrated circuit chip 8 are connected to each other via the bonding wires 6a, 6b, 6c, and 6d, respectively. In this case, both of them are connected to each other via one bonding wire (see FIG. I in JP06-80671B).

DISCLOSURE OF THE INVENTION

Problem to be Solved by the Invention

According to the configuration of the conventional PDP driver and semiconductor integrated circuit device, it is possible to obtain a desired operation without any problem at the time of a normal operation. However, at the time of the normal operation, it has been known that when the conductive leads are short-circuited with each other outside the resin package due to external factors, the semiconductor integrated circuit device deteriorates in characteristic, or in some cases, the semiconductor integrated circuit chip 8 is damaged.

Particularly, in a semiconductor integrated circuit device used in a driver such as the PDP driver using a high voltage, there is a case where the temperature of the bonding wire 6 suddenly increases when the conductive leads are short circuited with each other.

Specifically, when a short circuit occurs between the high-voltage power supply conductive lead and the output conductive lead, or between the output conductive lead and the grounding potential conductive lead, overcurrent flows from the external power supply 12 to the damaged semiconductor integrated circuit chip 8. Here, in the semiconductor integrated circuit device of the conventional technology, the bonding pad 5 and the conductive lead 7 are connected to each other via one bonding wire 6, and there is a case where temperature increase of the bonding wire 6 is suddenly caused by overcurrent generated from a power supply since the impedance of the bonding wire 6 itself is large.

Means for Solving the Problems

In consideration of the above-mentioned conventional problems, an object of the present invention is to provide a semiconductor integrated circuit device capable of preventing temperature increase of a bonding wire even when conductive leads are short-circuited with each other and improving the reliability, and to provide a PDP driver and a plasma display panel including the semiconductor integrated circuit device.

To achieve the object, the semiconductor integrated circuit device according to the invention includes: a semiconductor integrated circuit chip that has a high breakdown voltage output circuit for driving an external output load; a resin package that has the semiconductor integrated circuit chip mounted thereon; and a bonding wire of which one end is connected to a conductive lead of the resin package and the other end is connected to a bonding pad formed on the semiconductor integrated circuit chip. In the semiconductor integrated circuit device, at least the bonding pad for supplying power to a power supply section of the semiconductor integrated circuit chip is connected with the conductive lead of the resin package by a plurality of wires.

In the semiconductor integrated circuit device according to the invention, the conductive lead for supplying power to the power supply section of the semiconductor integrated circuit chip is connected with the bonding pad of the semiconductor integrated circuit chip, and the conductive lead connected to a GND for supplying a grounding potential to the power supply section of the semiconductor integrated circuit chip is connected with the bonding pad of the semiconductor integrated circuit chip, by the plurality of wires.

In the semiconductor integrated circuit device according to the invention, the number of the plurality of wires is two or four.

In the semiconductor integrated circuit device according to the invention, a plurality of conductive leads are employed as a set.

In the semiconductor integrated circuit device according to the invention, a plurality of bonding pads are employed as a set.

A first PDP driver according to the invention includes the first semiconductor integrated circuit device mounted thereon; and an external power supply for supplying power to the semiconductor integrated circuit device through a conductive lead.

In the second PDP driver according to the invention, the external power supply for supplying power to the semiconductor integrated circuit device of the first PDP driver has a current limit function.

A first plasma display panel according to the invention has the first semiconductor integrated circuit device mounted thereon.

A second plasma display panel according to the invention has the second PDP driver mounted thereon.

Effect of the Invention

In the semiconductor integrated circuit device according to the invention, the bonding pad is connected with the conductive lead by the plurality of wires. In addition, in the PDP driver according to the invention, the external power supply has a current limit function. With such a configuration, it is possible to decrease power consumption in wire and suppress temperature increase of the bonding wire caused by overcurrent, for example, even when a short circuit occurs between the high-voltage power supply conductive lead and the output conductive lead, or between the output conductive lead and the grounding potential conductive lead. When such semiconductor integrated circuit device is used in the PDP driver, it is possible to improve the reliability.

BEST MODE FOR CARRYING OUT THE INVENTION

Hereinafter, embodiments of the invention will be described with reference to the drawings.

Embodiment 1

Figure 1:
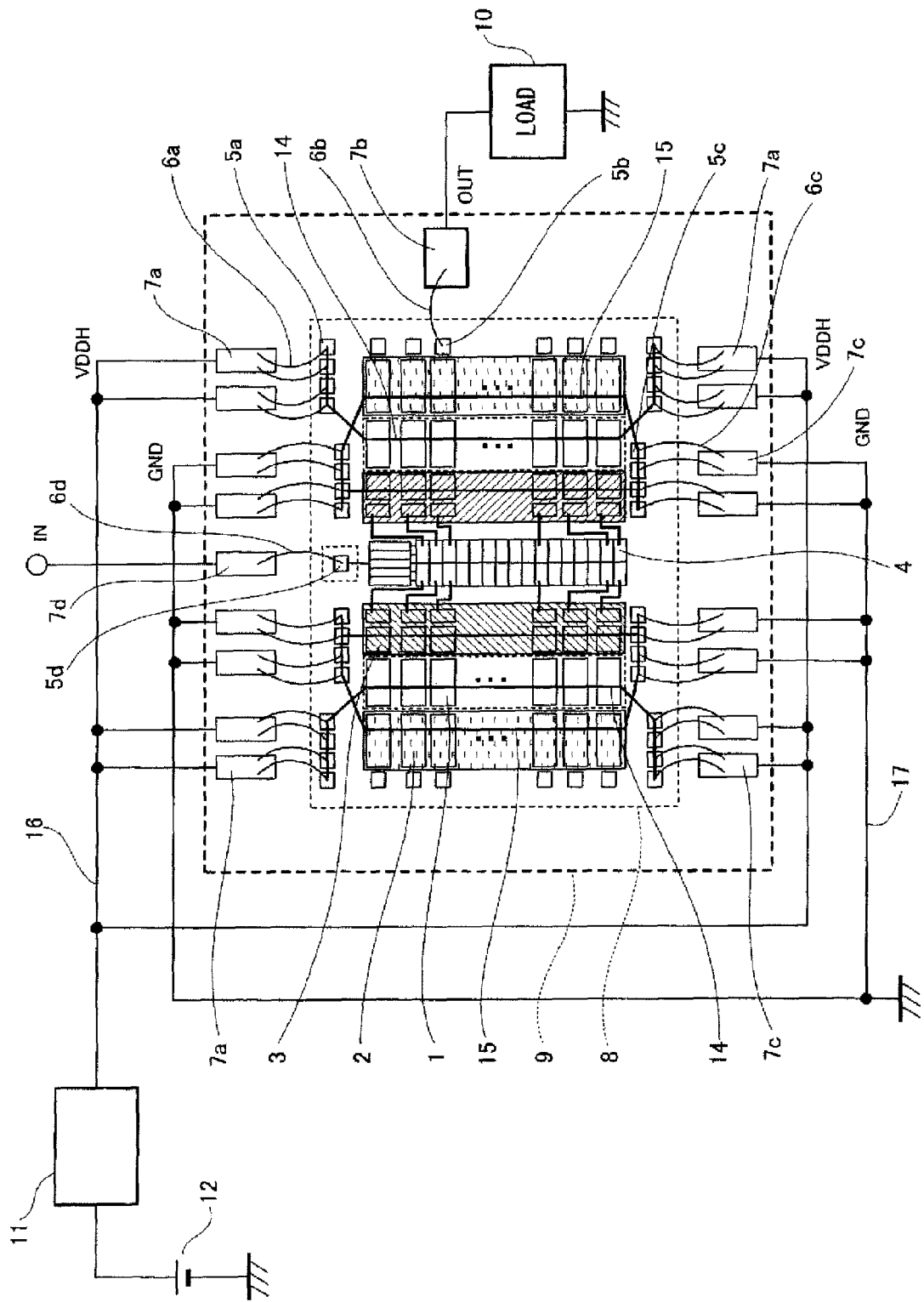
FIG. 1 is a configuration diagram illustrating a semiconductor integrated circuit device in a PDP driver according to Embodiment 1 of the invention.
Figure 3:
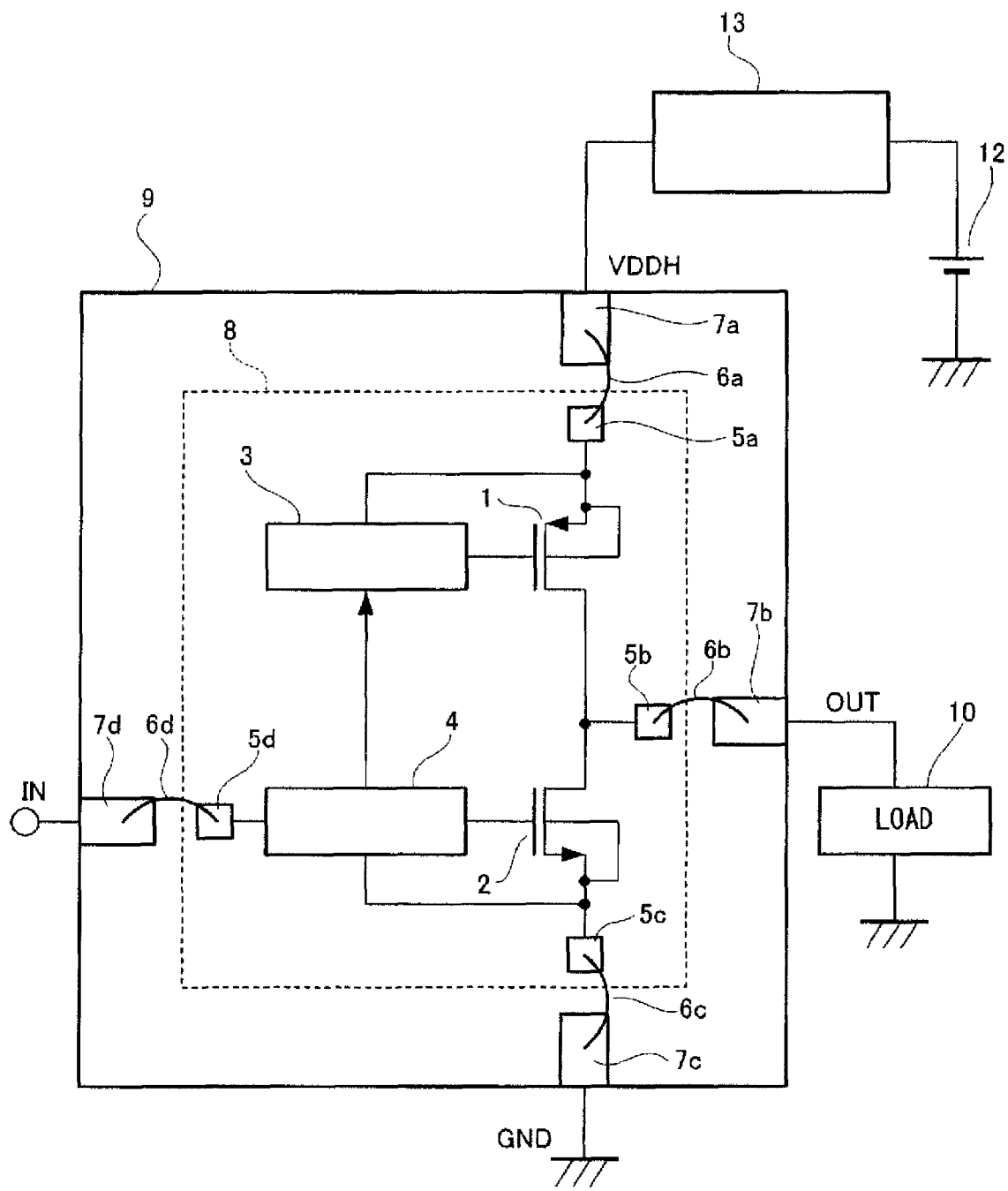
FIG. 3 is a configuration diagram illustrating a semiconductor integrated circuit device in a conventional PDP driver.

FIG. 1 is a configuration diagram illustrating a semiconductor integrated circuit device and a PDP driver according to Embodiment 1 of the invention. The common elements corresponding to the elements described in FIG. 3 are denoted by the same reference numerals and signs.

In the reference numerals and signs in FIG. 1, reference numeral 1 represents a high side transistor, reference numeral 2 represents a low side transistor, reference numeral 3 represents a level shift circuit, reference numeral 4 represents a pre-driver, reference numerals 5a, 5b, 5c, and 5d represent bonding pads, reference numerals 6a, 6b, 6c, and 6d represent bonding wires (wires), reference numerals 7a, 7b, 7c, and 7d represent conductive leads, reference numeral 8 represents a semiconductor integrated circuit chip, reference numeral 9 represents a resin package, reference numeral 10 represents an external output load, reference numeral 11 represents a current-limited DC/DC converter, and reference numeral 12 represents an external power supply.

The semiconductor integrated circuit device is formed of the semiconductor integrated circuit chip 8 and the resin package 9. The resin package 9 is molded with epoxy resin and the like.

In the semiconductor integrated circuit chip 8, multiple high breakdown voltage output circuits are provided. In the high breakdown voltage output circuits, a lot of the high side transistors 1 and the low side transistors 2 are disposed, the level shift circuit 3 and the pre-driver 4 are arranged with these transistors 1 and 2. A lot of the high breakdown voltage output circuits are disposed parallel to one side of the chip 8, and thus a multi-output semiconductor integrated circuit chip 8 used as a PDP driver is provided. In addition, the bonding pads 5a, 5b, 5c, and 5d are disposed on a peripheral portion of the semiconductor integrated circuit chip 8. The high breakdown voltage output circuit switches the high side transistor 1 and the low side transistor 2 in accordance with a signal inputted to the pre-driver 4 from an outside through an input conductive lead IN, and thus gives a high voltage electric potential or a grounding potential to the external output load 10.

In the resin package 9, the conductive leads 7a, 7b, 7c, and 7d are provided in order to give a power supply electric potential, a grounding potential, and an input signal to the semiconductor integrated circuit chip 8 and to give an output potential from the semiconductor integrated circuit chip 8 to the external output load 10. The conductive leads 7a, 7b, 7c, and 7d are connected with the corresponding bonding pads 5a, 5b, 5c, and 5d by the bonding wires 6a, 6b, 5c, and 6d.

The bonding pads 5a and 5c for giving a power supply electric potential and a grounding potential to the semiconductor integrated circuit chip 8 are disposed to interpose the high breakdown voltage output circuit, which is disposed along the one side of the semiconductor integrated circuit chip 8, therebetween. Therefore, it is possible to reduce resistance components of a power supply electric potential and a grounding potential of the semiconductor integrated circuit chip 8.

In Embodiment 1, a set of four bonding pads 5a is disposed on an end portion of a wire 14 for supplying a power supply electric potential to the high side transistor 1. In addition, a set of four bonding pads 5c is also disposed on an end portion of a wire 15 for supplying a grounding potential to the low side transistor 2. The bonding pads 5a for the high side transistor 1 are disposed on corner portions of the semiconductor integrated circuit chip 8, and the bonding pads 5c for the low side transistor 2 are disposed to be interposed between the two sets of the bonding pads 5a.

In order to supply power from the external power supply 12 and the current-limited DC/DC converter 11 to the high side transistor 1 serving as a first power supply section of the semiconductor integrated circuit chip 8 in the semiconductor integrated circuit device, a set of two conductive leads 7a is disposed on positions corresponding to the bonding pads 5a of the resin package 9. Each of the conductive leads 7a is directly connected to a wire 16 extending from the DC/DC converter 11.

In addition, one ends of a plurality of the bonding wires 6a (in this example, the number of the wires is two) are connected to one conductive lead 7a, and the other end of each bonding wire 6a is connected to one bonding pad 5a. Accordingly, in the embodiment, a set of the two conductive leads 7a is connected with a set of the four bonding pads 5a by four bonding wires 6a. Accordingly, a power supply electric potential generated from the external power supply 12 is supplied to the semiconductor integrated circuit chip 8.

In addition, in order to be connected to a GND conductive lead and supply a grounding potential to the low side transistor 2 serving as a second power supply section of the semiconductor integrated circuit chip 8, a set of two conductive leads 7c is disposed on positions corresponding to the bonding pads 5c for the low side transistor 2 of the resin package 9. Each of the conductive leads 7c is directly connected to a wire 17 connected to a GND.

In addition, one ends of two bonding wires 6c are connected to one conductive lead 7c, and the other end of each bonding wire 6c is connected to one bonding pad 5c. Accordingly, in the embodiment, a set of the two conductive leads 7c is connected with a set of the four bonding pads 5c by the four bonding wires 6c. Accordingly, a grounding potential is supplied to the semiconductor integrated circuit chip 8.

Here, the bonding wires 6a and 6c are connected to the conductive leads 7a and 7c and the bonding pads 5a and 5c for inputting a grounding potential and a power supply electric potential to the high breakdown voltage output circuit of the semiconductor integrated circuit chip 8. In this case, the number of the bonding wires 6a and 6c has to be determined such that power consumption in wire is adapted to avoid temperature increase of each bonding wire.

In detail, power consumption in the bonding wires is calculated from an impedance determined by the number of the bonding wires used and an overcurrent value generated from the external power supply 12 when a short circuit occurs between high-voltage power supply conductive leads VDDH and output conductive leads OUT, or between the output conductive leads OUT and grounding potential conductive leads GND. In addition, a material of the resin package 9 is also considered. Thus, the number of bonding wires to avoid sudden temperature increase of the bonding wires is determined.

In this manner, by using the determined number of the bonding wires 6a and 6c, temperature increase in the bonding wires 6a and 6c can be avoided even when the conductive leads 7a and 7c are short-circuited with each other outside the resin package 9 due to some external factors and the semiconductor integrated circuit chip 8 is damaged, at the time of the normal operation. Thus, it is possible to improve reliability with respect to the semiconductor integrated circuit device.

In addition, the DC/DC converter 11 used in the embodiment is a DC/DC converter having a current limit function used in a PDP driver to boost the electric potential of the external power supply 12 into a high voltage. Hence, even when a short circuit occurs between the high-voltage power supply conductive leads VDDH and the output conductive leads OUT, or between the output conductive leads OUT and the grounding potential conductive leads GND, overcurrent flowing into the semiconductor integrated circuit chip 8 is limited, and power consumption in the bonding wires 6a and 6c is reduced. Thus, it is possible to improve reliability with respect to the semiconductor integrated circuit device.

Embodiment 2

Figure 2:
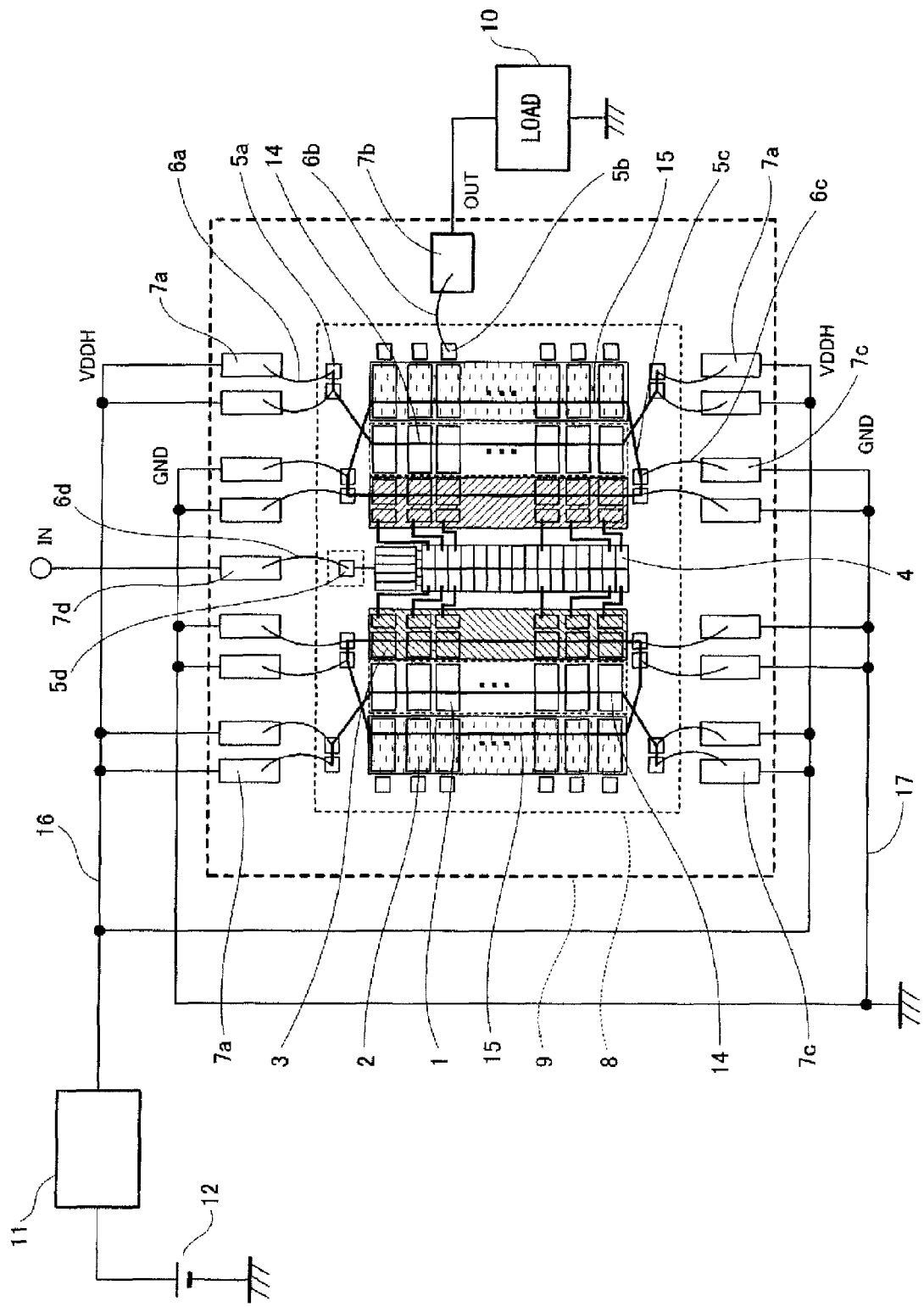
FIG. 2 is a configuration diagram illustrating a semiconductor integrated circuit device in a PDP driver according to Embodiment 2 of the invention.

FIG. 2 is a configuration diagram illustrating a semiconductor integrated circuit device and a PDP driver according to Embodiment 2 of the invention.

Embodiment 2 has the same basic configuration as that of Embodiment 1 mentioned above. Specifically, the PDP driver according to Embodiment 2 has the same configuration as that of Embodiment 1 in the following elements: a high side transistor 1, a low side transistor 2, a level shift circuit 3, a pre-driver 4, conductive leads 7a, 7b, 7c, and 7d, a semiconductor integrated circuit chip 8, a resin package 9, an external output load 10, a current-limited DC/DC converter 11, and an external power supply 12. However, the configuration of bonding pads 5a and 5c and bonding wires 6a and 6c is different.

In Embodiment 2, a set of two bonding pads 5a is disposed on an end portion of a wire 14 for supplying a power supply electric potential to the high side transistor 1. In addition, a set of two bonding pads 5c is also disposed on an end portion of a wire 15 for supplying a grounding potential to the low side transistor 2. The bonding pads 5a for the high side transistor 1 are disposed on corner portions of the semiconductor integrated circuit chip 8, and the bonding pads 5c for the low side transistor 2 are disposed to be interposed between two sets of the bonding pads 5a.

In addition, a set of two conductive leads 7a is disposed on positions corresponding to the bonding pads 5a of the resin package 9. Each of the conductive leads 7a is directly connected to a wire 16 extending from the DC/DC converter 11.

In addition, one end of one bonding wire 6a is connected to one conductive lead 7a, and the other end of each wire 6a is connected to one bonding pad 5a. Accordingly, in Embodiment 2, a set of the two conductive leads 7a is connected with a set of the two bonding pads 5a by two bonding wires 6a. Accordingly, a power supply electric potential generated from the external power supply 12 is supplied to the semiconductor integrated circuit chip 8.

In addition, in order to be connected to a GND conductive lead and supply a grounding potential to the low side transistor 2 serving as a second power supply section of the semiconductor integrated circuit chip 8, a set of two conductive leads 7c is disposed on positions corresponding to the bonding pads 5c for the low side transistor 2 of the resin package 9. Each of the conductive leads 7c is directly connected to a wire 17 connected to a GND.

In addition, one end of one bonding wire 6c is connected to one conductive lead 7c, and the other end is connected to one bonding pad 5c. Accordingly, in the embodiment, a set of the two conductive leads 7c is connected with a set of the two bonding pads 5c by the two bonding wires 6c. Accordingly, a grounding potential is supplied to the semiconductor integrated circuit chip 8.

In Embodiment 2, by using the two bonding wires 6a and 6c as described above, temperature increase in the bonding wires 6a and 6c can be avoided even when the conductive leads 7a and 7c are short-circuited with each other outside the resin package 9 due to some external factors and the semiconductor integrated circuit chip 8 is damaged, at the time of the normal operation. Thus, it is possible to improve reliability with respect to the semiconductor integrated circuit device.

In addition, even when a short circuit occurs between high-voltage power supply conductive leads VDDH and output conductive leads OUT, or between the output conductive leads OUT and grounding potential conductive leads GND, overcurrent flowing into the semiconductor integrated circuit chip 8 is limited, and power consumption in the bonding wires 6a and 6c is reduced. Thus, it is possible to improve reliability with respect to the semiconductor integrated circuit device.

In Embodiments 1 and 2 mentioned above, an exemplary configuration is shown in which a set of two conductive leads 7a and 7c or a set of two or a set of four bonding pads 5a and 5c are employed, and two or four bonding wires 6a and 6c are connected therebetween. However, the invention is not limited to the embodiments in the number of the conductive leads 7a and 7c, and the bonding pads 5a and 5c. In addition, a connection method of the bonding wires is not limited if the plurality of bonding wires 6a and 6c are employed so as not to overly increase temperature of the bonding wires 6 by overcurrent flowing from the power supply to the bonding wires.

INDUSTRIAL APPLICABILITY

The invention is applied to a semiconductor integrated circuit device formed of a resin package on which a semiconductor integrated circuit chip having a high breakdown voltage output circuit is mounted. Particularly, when the invention is applied to a diver for driving a PDP, it is possible to improve reliability with respect to the semiconductor integrated circuit device even when a short circuit occurs between a high-voltage power supply conductive lead and an output conductive lead, and between the output conductive lead and a grounding potential conductive lead.

The invention claimed is:

1. A semiconductor integrated circuit device comprising:
a semiconductor integrated circuit chip having a high breakdown voltage output circuit for driving an external output load;
a resin package upon which the semiconductor integrated circuit chip is mounted;
a power supply section in the high breakdown voltage output circuit of the semiconductor integrated circuit chip;
at least one first bonding pad on the semiconductor integrated circuit chip for supplying electric potential to the power supply section;
at least one second bonding pad on the semiconductor integrated circuit chip for grounding the power supply section;
at least one power supply conductive lead on the resin package for supplying electric potential to the at least one first bonding pad;
at least one grounding potential conductive lead on the resin package for grounding the at least one second bonding pad;
at least one first bonding wire having one end connected to the at least one first bonding pad and another end connected to the at least one power supply conductive lead; and
at least one second bonding wire having one end connected to the at least one second bonding pad and another end connected to the at least one grounding potential conductive lead,
wherein the at least one first bonding pad for supplying electric potential to the power supply section of the semiconductor integrated circuit chip comprises a plurality of first bonding pads, the at least one power supply conductive lead comprises a plurality of power supply conductive leads whose number is no more than the number of first bonding pads, and the at least one first bonding wire having one end connected to the first bonding pad and another end connected to the power supply conductive lead comprises a plurality of first bonding wires whose number is equal to the number of first bonding pads.

2. The semiconductor integrated circuit device according to claim 1, wherein the at least one second bonding pad for grounding the power supply section of the semiconductor integrated circuit chip comprises a plurality of second bonding pads, the at least one grounding potential conductive lead comprises a plurality of grounding potential conductive leads whose number is no more than the number of second bonding pads, and the at least one second bonding wire having one end connected to the second bonding pad and another end connected to the grounding potential conductive lead comprises a plurality of second bonding wires whose number is equal to the number of second bonding pads.

3. The semiconductor integrated circuit device according to claim 1, wherein the number of first bonding wires is two or four.

4. The semiconductor integrated circuit device according to claim 1, wherein the plurality of power supply conductive leads are employed as a set, and the plurality of first bonding pads are employed as a set.

5. The semiconductor integrated circuit device according to claim 2, wherein the plurality of grounding potential conductive leads are employed as set, and the plurality of second bonding pads are employed as a set.

6. A PDP driver having:
a semiconductor integrated circuit device according to claim 1 mounted thereon; and
an external power supply for supplying power to the semiconductor integrated circuit device through the plurality of power supply conductive leads.

7. The PDP driver according to claim 6, wherein the external power supply for supplying power to the semiconductor integrated circuit device has a current limit function.

8. A plasma display panel having a semiconductor integrated circuit device according to claim 1 mounted thereon.

9. A plasma display panel having a PDP driver according to claim 7 mounted thereon.

10. The semiconductor integrated circuit device according to claim 2, wherein the number of second bonding wires is two or four.

11. The semiconductor integrated circuit device according to claim 1, wherein at least two of the first bonding wires are connected to one of the power supply conductive leads.

12. The semiconductor integrated circuit device according to claim 2, wherein at least two of the second bonding wires are connected to one of the grounding potential conductive leads.

13. The semiconductor integrated circuit device according to claim 1, wherein the first bonding pad for supplying electric potential to the power supply section of the semiconductor integrated circuit chip is in a corner portion of the semiconductor integrated circuit chip.

14. The semiconductor integrated circuit device according to claim 2, wherein the first bonding pad for supplying electric potential to the power supply section of the semiconductor integrated circuit chip is in a corner portion of the semiconductor integrated circuit chip.

15. The semiconductor integrated circuit device according to claim 4, wherein the set of first bonding pads comprises at least two sets of first bonding pads, and the second bonding pad for grounding the power supply section of the semiconductor integrated circuit chip is between the two sets of first bonding pads.

* * * * *